(12) United States Patent
Tenailleau et al.

(10) Patent No.: US 9,412,681 B2
(45) Date of Patent: Aug. 9, 2016

(54) INTERPOSER DEVICE

(71) Applicant: IPDIA, Caen (FR)

(72) Inventors: Jean-René Tenailleau, Hottot-les-Bagues (FR); Gilles Ferru, Cairon (FR)

(73) Assignee: IPDIA, Caen (FR)

( * ) Notice: Subject to any disclaimer, the term of this patent is extended or adjusted under 35 U.S.C. 154(b) by 118 days.

(21) Appl. No.: 14/363,937

(22) PCT Filed: Dec. 6, 2012

(86) PCT No.: PCT/EP2012/074680
§ 371 (c)(1),
(2) Date: Jun. 9, 2014

(87) PCT Pub. No.: WO2013/083714
PCT Pub. Date: Jun. 13, 2013

(65) Prior Publication Data
US 2014/0299963 A1     Oct. 9, 2014

(30) Foreign Application Priority Data
Dec. 9, 2011  (EP) ..................................... 11306634

(51) Int. Cl.
*H01L 23/48*     (2006.01)
*H01L 27/08*     (2006.01)
(Continued)

(52) U.S. Cl.
CPC ........ *H01L 23/481* (2013.01); *H01L 21/76898* (2013.01); *H01L 27/0814* (2013.01);
(Continued)

(58) Field of Classification Search
CPC ............ H01L 21/76898; H01L 23/147; H01L 23/481; H01L 23/49827; H01L 25/167; H01L 27/0814; H01L 33/62; H01L 2224/02372; H01L 2924/1305
See application file for complete search history.

(56) References Cited

U.S. PATENT DOCUMENTS 5,187,119 A     2/1993   Cech et al.
6,475,821 B2 *  11/2002  Honda .................. G01F 1/6845
                                                    216/2
(Continued)

FOREIGN PATENT DOCUMENTS

DE     197 29 156     2/1998
DE     102 05 026     5/2003
(Continued)

OTHER PUBLICATIONS

International Search Report for international application No. PCT/EP2012/074680, dated Feb. 1, 2013 (6 pages).
(Continued)

*Primary Examiner* — Eric Ward
(74) *Attorney, Agent, or Firm* — Hamre, Schumann, Mueller & Larson, P.C.

(57) ABSTRACT

The invention relates to an interposer device comprising a doped silicon substrate (1) having an epitaxial layer (24) on a first side and two through vias (11, 12) extending from the first side to a second side opposite to the first side of the doped silicon substrate. Each through via comprises a volume of doped silicon substrate delimited by a surrounding trench (7) extending from the first to the second side of the doped silicon substrate such that said surrounding trench is arranged so as to electrically isolate the doped silicon substrate surrounded by said trench. First and second conductive layers (121, 122) are laid respectively on first and second sides of the first through via so as to be electrically connected together and third and fourth conductive layers (112, 11) are laid respectively on surfaces of the second through via so as to be electrically connected together. The first (122) and third (112) conductive layers are connected together by means of a back-to-back diode (35) wherein the diodes are isolated by a diode trench (6) having a depth at least equal to that of the epitaxial layer (24). A method of forming the interposer device is also provided.

18 Claims, 6 Drawing Sheets

(51) Int. Cl.
*H01L 21/768* (2006.01)
*H01L 23/14* (2006.01)
*H01L 23/498* (2006.01)
*H01L 25/16* (2006.01)
*H01L 33/62* (2010.01)

(52) U.S. Cl.
CPC ......... *H01L23/147* (2013.01); *H01L 23/49827* (2013.01); *H01L 25/167* (2013.01); *H01L 33/62* (2013.01); *H01L 2224/02372* (2013.01); *H01L 2924/1305* (2013.01)

(56) References Cited

U.S. PATENT DOCUMENTS

| | | | |
|---|---|---|---|
| 6,670,271 | B1 | 12/2003 | Subramanian et al. |
| 7,646,079 | B2 * | 1/2010 | Umemoto ......... H01L 21/76898 257/621 |
| 8,026,576 | B2 * | 9/2011 | Murayama ........... H01L 23/481 257/603 |
| 8,026,610 | B2 * | 9/2011 | Murayama ........... H01L 21/486 257/773 |
| 8,541,865 | B2 * | 9/2013 | Yannou ................. H01L 23/60 257/501 |
| 2003/0127724 | A1 * | 7/2003 | Senba ............... H01L 21/76898 257/698 |
| 2015/0171031 | A1 * | 6/2015 | Ker ........................ H01L 23/60 257/737 |

FOREIGN PATENT DOCUMENTS

| | | |
|---|---|---|
| EP | 0 974 817 | 1/2000 |
| EP | 2 045 840 | 4/2009 |
| JP | 2008-166705 | 7/2008 |
| WO | 2009/053912 | 4/2009 |

OTHER PUBLICATIONS

Written Opinion for international application No. PCT/EP2012/074680, dated Feb. 1, 2013 (11 pages).

* cited by examiner

INTERPOSER DEVICE

This invention relates generally to 3D integrated circuits or packages and, more particularly, to a silicon interposer allowing top to bottom conduction thanks to through silicon vias and to a method for manufacturing the same.

High brightness LEDs are very sensitive to electrostatic discharge (ESD) and to the thermal coefficient of expansion (TCE) of their packages. In order to get reliable high brightness LEDs, it is known to use naked LED chips mounted on a silicon interposer that improves the TCE mismatch and also provides ESD protection with integrated diodes. Devices integration and good thermal conductivity are the key advantages of the silicon submounts. However, in order to decrease the cost of packaging, surface mount technology is more and more used. Top to bottom connexions are necessary on the submount. The top to bottom connexions are provided by through vias.

A typical manufacturing process of a through via includes forming of through via holes and deposition of a diffusion barrier layer and a conductive seed layer. A conductive material is then electroplated into the holes. Copper is typically used as the conductive material, as copper has good thermal and electrical conductivity and is available in a highly pure state. Through via may have high aspect ratios, therefore depositing copper into such structures can be challenging.

The processing cost of such through vias is very high and is difficult to implement without specific equipments.

There exists a known method of planarization that is realized within integration schemes of the damascene type. However, this kind of integration scheme requires the use of a chemical-mechanical planarization (CMP) technique which is often expensive and difficult to implement, in particular with aluminium.

Further, an increase in the wafer metrology is required and frequently, materials processed using CMP contain potential defects including stress cracking, delaminating at weak interfaces, and the corrosive attacks from the chemicals utilised.

The use of vias in the manufacture of circuit board and particularly semiconductor devices is known. Indeed, patent Application number EP0974817 A1 describes a method of manufacturing a circuit board including the use of vias in a substrate. However, providing optimal conditions for the various components comprising a 3D integrated circuit remains a challenge.

It is an object of the invention to provide a silicon submount or interposer providing top bottom conduction without the use of expensive and difficult to implement through vias of the prior art. Further, the invention seeks to provide an improved method of providing a planarized base for an LED containing, for every layer of interconnection, a plurality of levels of photo-etching.

According to the present invention, there is provided an interposer device, comprising:

a doped silicon substrate having an epitaxial layer on a first side and two through vias extending from the first side to a second side opposite to the first side of the doped silicon substrate, wherein each through via comprises a volume of doped silicon substrate delimited by a surrounding trench extending from the first to the second side of the doped silicon substrate such that said surrounding trench is arranged so as to electrically isolate the doped silicon substrate surrounded by said trench;

first and second conductive layers laid respectively on first and second sides of the first through via so as to be electrically connected together;

third and fourth conductive layers laid respectively on surfaces of the second through via so as to be electrically connected together, the first and third conductive layers being connected together by means of a back-to-back diode wherein the corresponding diodes are isolated by a diode trench having a depth at least equal to that of the epitaxial layer.

An embodiment of the invention proposes an interposer device comprising a doped silicon substrate with a concentration of dopants in a range of, for example, $10^{17}$ to $10^{20}$ atoms per cubic centimeters, preferably the concentration of dopants is about $10^{19}$ atoms per cubic centimeters.

Advantageously, an interposer according to the invention does not necessitate the use of a conductive material different from the material of the interposer for building the through vias. Therefore, the production costs are reduced. Indeed, no specific equipments are required, the manufacturing processes are simpler. Furthermore, the invention prevents the use of copper for filling the through vias that may causes contaminations detrimental for the LEDs implanted on the interposer.

According to further embodiments which can be considered alone or in combination:

- The ratio H/S of said through via is smaller or equal to 1, with H the average distance between the first and second side of the through via and S the average width of the through via.
- The surrounding trench is at least partially filled with an isolating material.
- The isolating material is preferably thermal silicon oxide and/or other dielectric.
- In case of partial filling with oxide, the filling of the trench is completed by conformal deposition of alpha silicon or polysilicon or insulating material.
- The ratio H/e is greater or equal to 15, with H the average distance between the first and second side of the through via and e the average thickness of the surrounding trench.

It is another object of this invention to propose a new interposer manufacturing process which implements top bottom contacts according to the invention.

According to the present invention, there is also provided a method of forming an interposer device, comprising the steps of:

providing a doped silicon substrate having an epitaxial layer with a doping different to that of the remaining silicon substrate;

delimiting two through vias extending from a first to a second side of the doped silicon substrate, a diode implementation zone between the vias and a diode trench delimiting first and second areas of the diode implementation zone;

respectively isolating electrically each via, the first area and the second area of the diode implementation zone;

laying first and second conductive layers respectively on first and second sides of the first through via so as to be electrically connected together; and laying third and fourth conductive layers respectively on surfaces of the second through via so as to be electrically connected together;

wherein the first and third conductive layers being connected by the diodes of the diode implementation zone.

According to further embodiments which can be considered alone or in combination:

- The via defining step further comprises the step of etching a discontinued surrounding trench, leaving the volume of doped silicon delimited by the surrounding trenched mechanically and electrically connected by doped silicon bridges to the external doped silicon of the doped silicon substrate, and during the oxidation step the doped silicon bridges are oxidized so that the volume of doped silicon delimited by the surrounding trench is mechanically connected but electrically isolated from the external doped silicon of the doped silicon substrate, for example the widths of the bridges are smaller than or equal to the average thickness of the surrounding trench.

After the oxidation step alpha silicon or un-doped polysilicon is deposed in the surrounding trench.

During the via defining step, when the surrounding trench is etched all the way through the doped silicon substrate, the trench comprises doped silicon bridges.

During the via defining step the surrounding trench is etched through only part of the thickness of the doped silicon substrate prior to the oxidation step. The doped silicon substrate is then grinded so as to have the surrounding trench extend all the way through the doped silicon substrate.

Advantageously, this process is easy to implement and decreases the cost of via processing for the silicon interposer.

In a preferred embodiment, there are embedded in the epitaxial layer a pair of Zener diodes in a back to back configuration as a bipolar transistor. Higher doping rates can be used in the epitaxial zone at equivalent Zener tension, allowing increased doping of the base of the parasitic bipolar transistor and consequently reducing its gain. The use of an isolation trench between the diodes extends the effective length of the base of the parasitic transistor, reducing its gain. The combination of a higher doping rate and a longer insulation trench allows to lower the gain of transistor and to make the system immune to the conduction trigger of the parasitic bipolar transistor.

The interposer base of the present invention advantageously uses a process of planarization containing three levels of photo-etching insuring the planarization for every level of interconnection that comprises an insulation layer and a metallic level.

Preferred embodiments of the present invention will now be described, with reference to accompanying drawings, in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

Figure 1:
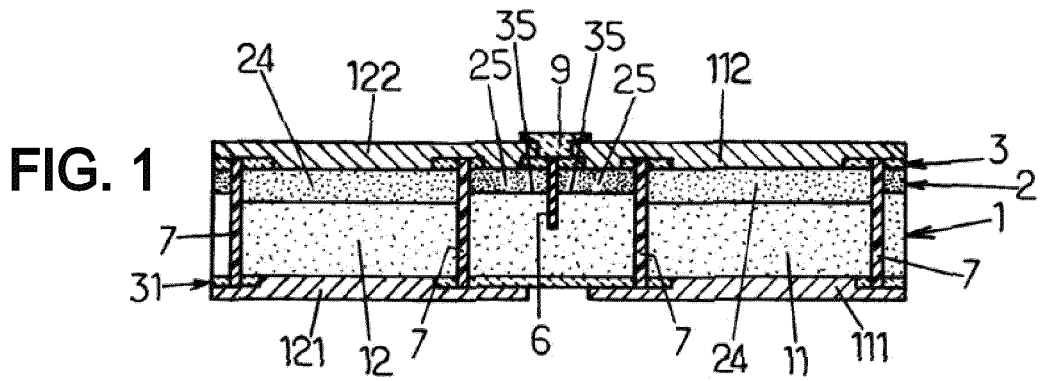
FIG. 1 is section view of the device according the present invention.

An embodiment of a silicon interposer according to the invention is presented in FIG. 1, in which a doped silicon substrate 1 is surmounted by an epitaxial layer 2 on its top side.

The interposer comprises two through silicon vias 12 and 11. Said through silicon vias 12 and 11 insure electrical conduction between the top side of the epitaxial layer 2 and the bottom side of the doped silicon substrate 1. Silicon through vias 11 and 12 comprise a volume of the doped silicon substrate 1 and of the epitaxial layer 2 delimited by surrounding trenches 7, said trenches 7 extending from the top side of the epitaxial layer 2 to the bottom side of the doped silicon substrate 1. Advantageously, the resistivity of the through vias 11 and 12 can be adjusted depending on the dopant concentration on the doped silicon substrate 1. For example, the doped silicon substrate is doped with N type dopants. For example, the concentration of dopants is in a range of $10^{17}$ to $10^{20}$ atoms per cubic centimeters. The area of the through silicon vias 11 and 12 can be very large. Advantageously, a large section minimized the vias electrical resistivity. In an embodiment of the invention, the ratio H/S of said through vias 11 and 12 is smaller or equal to 1, with H the average distance between the first and second side of the through vias 11 and 12 and S the average width of said through vias 11 and 12.

The resistance of a via according to the invention can be calculated as follows:

$$R = \rho H/A$$

where R is the resistance of the via, $\rho$ the resistivity of the doped silicon material, H the average distance between the first and second side of the through via and A the average cross-section area of said through via. Advantageously, the parameter $\rho$ can be adapted depending on the concentration of dopants in the doped silicon substrate 1. Advantageously, the parameter H/A can be chosen by the manufacturer of an interposer according to the invention. Therefore, the electrical resistance of a through silicon via according to the invention may be easily adapted depending on the application of the through silicon via.

The isolation between the via 11 or 12 and the external portion of silicon of the doped silicon substrate 1 is performed by surrounding trenches 7. Said surrounding trenches 7 are, at least, partially filled with an isolating material. Preferably the isolating material is a thermal silicon oxide and/or other dielectric. Preferably, the trenches 7 are further completely filled with a dielectric. For example the trenches 7 are filled by conformal deposition of alpha silicon or polysilicon or other insulating material. Preferably, the depth of said surrounding trenches 7 is in the range of 200 to 700 μm, for example 200 to 300 μm. Preferably, the isolation between the two through silicon vias 12 and 11 is completed by an oxide layer 3 deposited on the top side of the epitaxial layer 2 and an oxide layer 31 deposited on the bottom side of the doped silicon substrate 1.

Each of the said through silicon vias 11 and 12 is electrically connected to first electrodes 112 and 122 and to second electrodes 111 and 121 situated respectively on first and second side of the doped silicon substrate 1.

Therefore, the through silicon vias 11 and 12 provide top to bottom conduction through the doped silicon substrate 1. Advantageously, said through silicon vias 12 and 11 provide top to bottom conduction through the doped silicon substrate 1 and the epitaxial layer 2.

The through silicon vias 11 and 12 are also connected to each other by two diodes 35 integrated in the epitaxial layer 2 disposed back to back and forming a back-to-back diode. Each of the said diodes 35 is connected to the adjacent top electrode 112 and 122.

The diodes 35 comprise a portion of the epitaxial layer 25 which is doped with a different type of dopant than the doped silicon substrate 1. For example, the doped silicon substrate is doped with N-type dopants and the epitaxial portions 25 are doped with P-type dopants, and the diodes 35 are PN silicon diodes. Advantageously, said diodes 35 are highly integrated in the silicon submount whatever the level of breakdown voltage of these diodes 35.

The isolation between the two back to back diodes is performed by a diode trench 6. Said diode trench 6 is, at least, partially filled with an isolating material. Preferably the isolating material is a thermal silicon oxide and/or other dielectric. Preferably, the trench 6 is further completely filled with a dielectric. For example the trench 6 is filled by conformal deposition of alpha silicon or polysilicon or other insulating material. Preferably, the depth of said diode trench 6 is in the range of 1 to 20 μm. More preferably, the diode trench is of a depth at least that of the epitaxial layer thereby protecting the continuity of the electric connection between the diodes. Preferably, the thickness of said diode trench 6 is in the range of 0.8 to 1 μm.

The interposer also comprises a passivation layer 9 situated between the two top electrodes 112 and 122. Advantageously, said passivation layer 9 insures that the two top electrodes are connected each other only by the diodes 35.

The portions 24, of the epitaxial layer 2, being included in the through silicon vias 11 and 12, are highly doped with dopants of the same type as the dopants of the doped silicon substrate 1. For example, if the doped silicon substrate 1 is doped with N-type dopant, the epitaxial portions 24 are also doped with N-type dopants. In an embodiment of the invention, the concentration of dopant in the portions 24 of the epitaxial layer is higher than the concentration if dopant in the silicon substrate 1. For example in the portions 24 the concentration of dopant is in a range of $10^{17}$ to $10^{20}$ atoms per cubic centimeters. Advantageously, the doped portion 24 of a through silicon via 11 or 12 insure a deep well electrical contact with the top electrode 112 and 122 with which the vias 11 or 12 are connected.

The peripheral insulation of the back-to-back diode facilitates the use of higher doping rates for the epitaxial layer at equivalent Zener tension allowing increased doping of the base of the parasitic bipolar transistor and consequently reducing its gain. The use of an isolation trench between the diodes extends the effective length of the base of the parasitic transistor, reducing its gain. For example, the combination of a higher doping rate and longer insulation trench lowers the gain of transistors to a value of less than one, making the system immune to the conduction trigger of the parasitic bipolar transistor.

The top electrodes 112 and 122 comprise at least one metallic layer. Said metallic layer is deposited on the portion of the doped silicon substrate 1 that constitute a through silicon via 11 or 12 and on the adjacent doped portion 25 of the epitaxial layer 2. For example, the top electrodes are made of aluminium or copper. In an embodiment of the invention, the first metallic layer is plated with gold alloy, for example TiNiAu or TiPtAu. The bottom electrodes 111 and 121 comprise at least one metallic layer deposited on the side of the through silicon via opposing to the top electrode 112 and 122 respectively. For example said electrodes 111 and 121 are made of aluminium, copper, or gold alloy, for example TiNiAu or TiPtAu.

The interposer also comprises a passivation layer 9 situated between the two top electrodes 112 and 122. Advantageously, said passivation layer 9 insures that the two top electrodes 102 are connected each other only by the diodes 35.

Referring to FIG. 2, an exemplary embodiment of a manufacturing method according to the invention for an interposer as shown in FIG. 1 is described in detail.

Figure 2A:
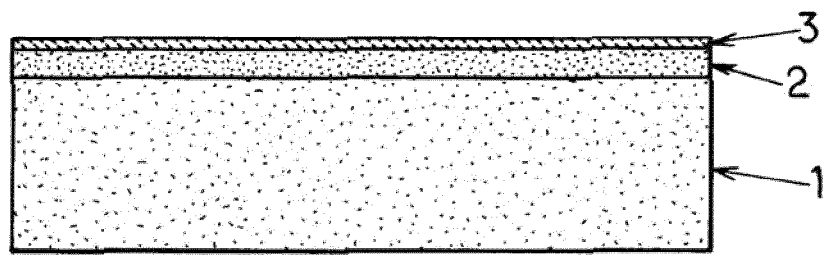
FIGS. 2A to 2J illustrate steps in the method of manufacturing the device of the present invention.

As illustrated on FIG. 2A, a silicon substrate 1 highly doped for example with N type dopant, for example Arsenic or Antimony or Phosphorus, is provided. For example, the concentration of dopants is in a range of $10^{17}$ to $10^{20}$ atoms per cubic centimeters. The resistivity of the silicon substrate 1 can be adjusted, depending on the dopant concentration. In the first step A, an epitaxial layer 2 is deposited on top of the silicon substrate 1. The thickness and the resistivity of said epitaxial layer 2 may be chosen according to the desired electrical characteristics of the diodes 35. The first step further comprises the growth of a silicon oxide layer 3 above the epitaxial layer 2.

Figure 2B:
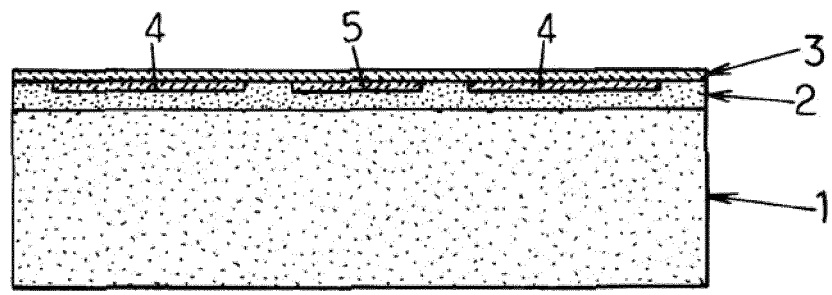

As shown in FIG. 2B, in this step two doped layers are implanted within the epitaxial layer 2.

In order to build in the diodes 35, a P or N doped layer 5 is needed. For example, if the silicon substrate 1 is doped with N dopants, it is necessary to deposit a P doped layer 5.

Then P or N doped layers 4 are deposited on the epitaxial layer 2. If the silicon substrate 1 is doped with N dopants, it is necessary to deposit a N doped layer 4.

According to an embodiment of the invention, the deposition of said doped layers 4 and 5 is performed by implant or by vapour deposition.

Figure 2C:
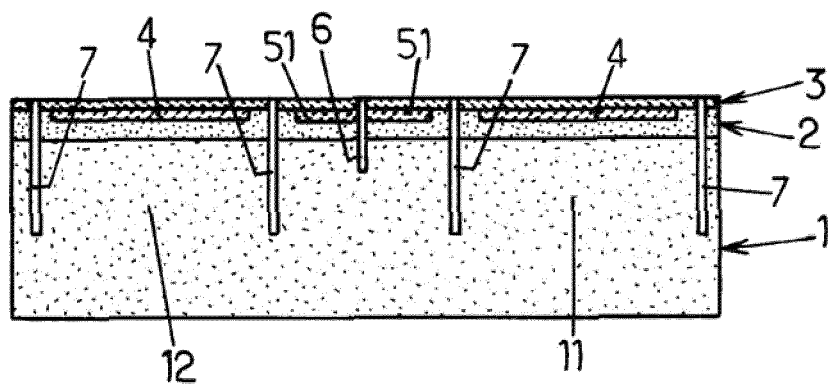
Figure 2D:
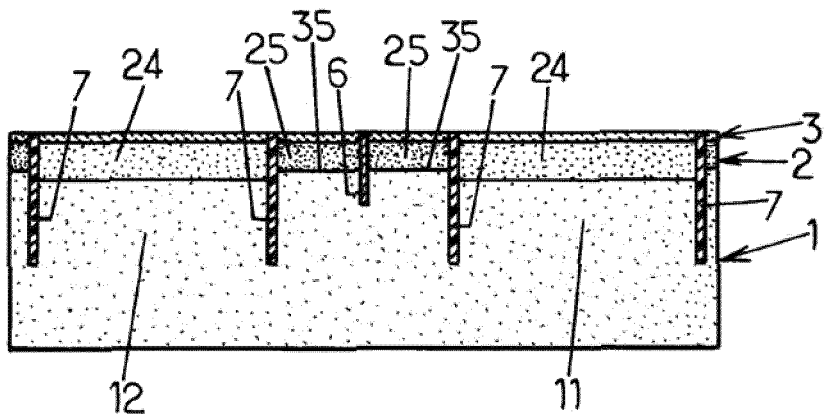

As shown in FIG. 2C, deep surrounding trenches 7 are etched. These surrounding trenches 7 are situated between said layers 4 and 5. In the embodiment of the invention presented FIG. 2, the depth of the surrounding trenches 7 is lower than the thickness of the silicon substrate 1, but is greater or equal than the final thickness of the interposer. In another embodiment of the invention, the surrounding trenches 7 may be etched all the way through the doped silicon substrate 1. The surrounding trenches 7 define the volume of the doped silicon substrate 1 that will constitute the through silicon vias 11 and 12 between the top electrodes 112 and 122 and the bottom electrodes 111 and 121.

In the interposer presented in FIG. 1, the through silicon vias are connected by a diode. During step C, a non-through trench 6 is etched. Preferably, said trench 6 separates the doped layer 5 in two subparts 51. Advantageously, these subparts 51 will provides the diodes 35 in a further step of the manufacturing process. Advantageously, the diode trench 6 will provide the isolation between the two diodes 35 disposed back to back. In an embodiment of the invention, the diode trench 6 is smaller than the surrounding trenches 7. For example, the diode trench 6 is less deep than the surrounding trenches 7. For example, the depth of the trench 6 is in the range of 1 to 20 μm, and the depth of the surrounding trenches 7 is in the range of 200 to 700 μm, for example 200 to 300 μm. In an embodiment of the invention, the depth and the width of both types of trenches are substantially proportional. Preferably, the width of the trenches 6 and 7 has to be quite narrow in order to facilitate the filling of said trenches in a further step of the manufacturing process.

In step D, the interposer is treated in order to make diffuse the N dopants of the doped layers 4 and the P dopants of the doped layer 5 deposited in step B. The diffusion of the dopants of the layer 5 in the volume of the epitaxial layer 2 delimited by the diode trench 6 and the vias trenches 7 lead to the diodes 35. The diodes 35 are constituted by the PN junction between the doped silicon substrate 1 and the said volume of epitaxial layer 2 wherein the dopants of the doped layer 5 have diffused. The dopants of the layer 4 diffuse in the epitaxial layer 2 to give conduction zones 24. Advantageously, said conduction zones 24 allow deep well electrical contact between the silicon substrate 1 and the top electrodes. In an embodiment of the invention, the dopants of the doped layer 4 can diffuse in the silicon substrate 1 and are not construed in the epitaxial layer 2.

In step D, an oxidation of the trenches 6 and 7 is performed. For example, the interposer is exposed to a heat treatment and a thermal silicon oxide is formed in the trenches 6 and 7. During this step, if the surrounding trenches 7 comprise bridges 13 as described above, said bridges 13 are also oxidized. Advantageously, the oxidation of the surrounding trenches 7 and of the bridges 13, provide the electrical isolation of the through silicon vias 11 and 12 from the external doped silicon of the silicon substrate. Advantageously, the delimited portion of doped silicon material remains mechanically connected but electrically isolated form the external doped silicon of the doped silicon substrate 1 thanks to the oxidised bridges 13. Advantageously, the oxidised diode trench 6 provides isolation between the diodes 35. In an embodiment of the invention, the trenches are not fully filled with oxide during the trenches' oxidation step, and the trenches may be further filled with isolating material. For example, the trenches are filled by deposition of alpha silicon or of doped or undoped polysilicon.

Figure 2E:
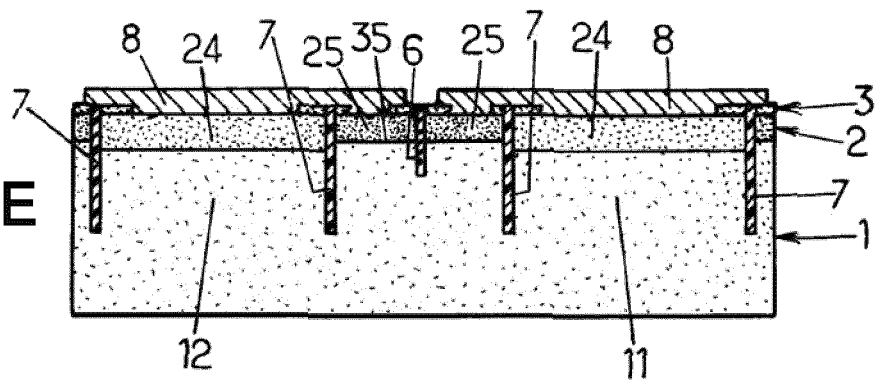
Figure 2F:
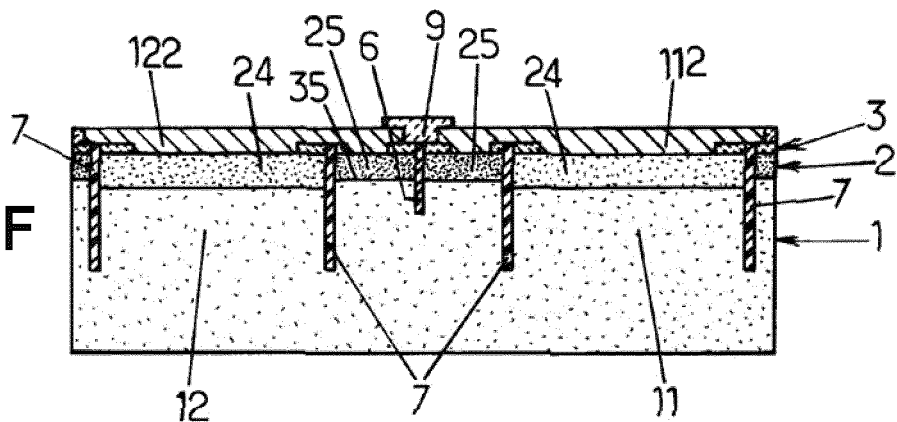
Figure 2G:
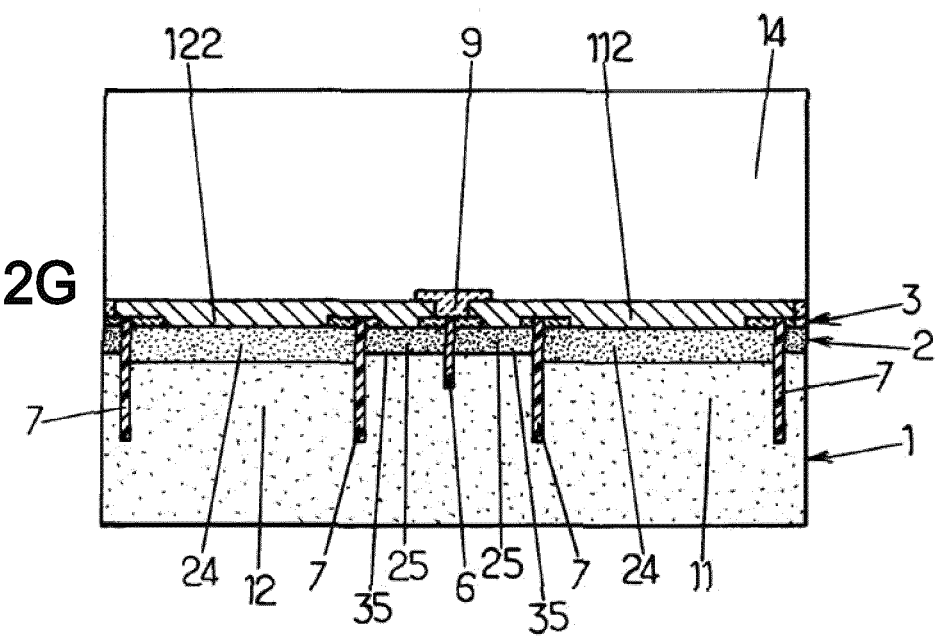

As shown in FIG. 2E, in step E, the top oxide layer 3 is etched in the contact area, and the metallic layers of the top electrodes 112 and 122 are deposited and patterned. In an embodiment of the invention the top oxide layer 3 is etched by a wet etching process. In an embodiment of the invention, before the metallic layer deposition, silicides are performed where the oxide layer 3 have been removed. Advantageously, this decrease the contact resistance between the conduction zones 24 and the metallic layers of the top electrodes 112 and 122. In an embodiment of the invention, the metallic layers 112 and 122 are deposited by sputter deposition or by sputter and electroplating. For example, said metallic layer is made of aluminium or copper. The patterning of the metallic layer is performed in step E after deposition of said metallic layer or during the deposition process.

In step F, a passivation layer 9 is performed. In an embodiment of the invention, a second metallic layer may be deposited and patterned over the first metallic layer of the top electrodes 112 and 122. Advantageously, said second metallic layer prevents oxidation of the top electrodes and allows an electronic device to be soldered or bonded on the silicon interposer. Advantageously, the passivation layer 9 provides electrical isolation between the top electrodes 112 and 122 and a proper encapsulation of the entire system improving its reliability. In an embodiment of the invention, the second metallic layer is deposited by bump deposition. For example, the second metallic layer is made of TiNiAu or TiPtAu. The patterning of the second metallic layer is performed in step F after deposition of said metallic layer or during the deposition process.

In step G, the wafer is reported on a hard carrier 14. The fixation of the wafer in the hard carrier 14 is made on the top side of the wafer. This advantageously eases the manufacturing process of the bottom face of the wafer.

Figure 2H:
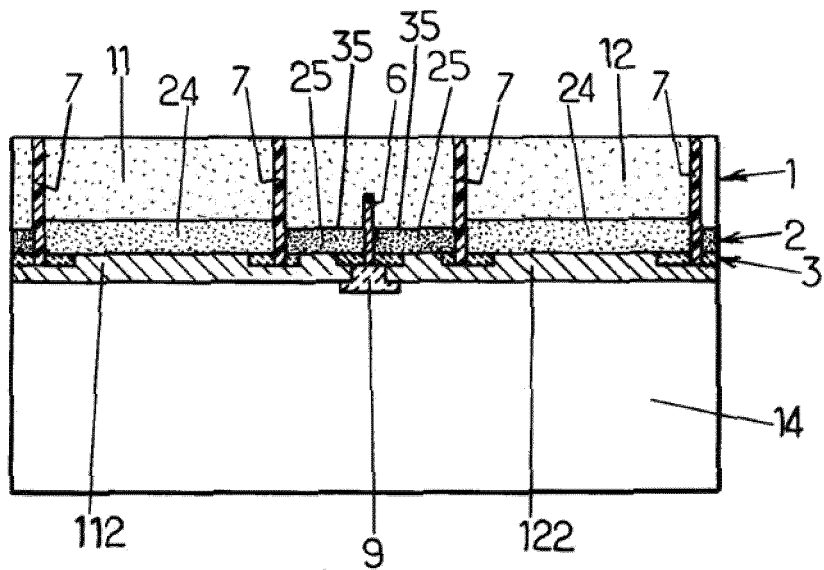

As shown in FIG. 2H, in step H the wafer is ground on its bottom side. For example, the wafer is ground in order to approximately give its final thickness to the interposer. In the embodiment of the invention depicted in FIGS. 2C to 2G, the surrounding trenches 7 are less deep than the doped silicon substrate 1, but the depth of said surrounding trenches 7 is greater than the final thickness of the interposer. Consequently, after the grinding step H that possibly includes a step of stress release (for example by SF6 dry etching), the surrounding trenches 7 extend all the way through the remaining doped silicon substrate 1. Consequently, the through conduction vias 11 are now isolated from the external portion of the doped silicon substrate by the surrounding trenches 7.

Figure 2I:
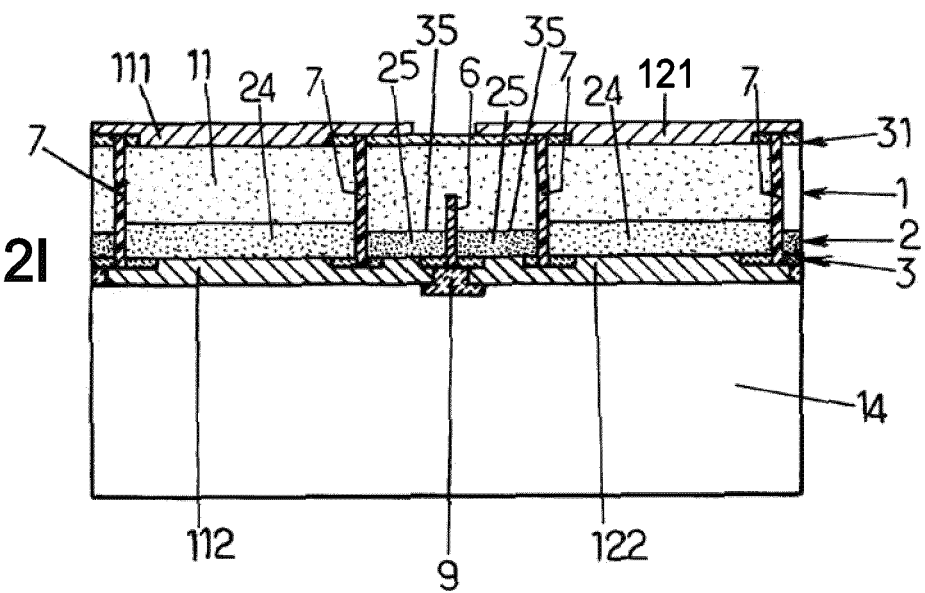

As depict in FIG. 2I, an oxide layer 31 is deposited on the bottom face of the wafer. Further, as in step E, the bottom oxide layer 31 is etched in the contact area, and metallic layers 111 and 121 are deposited and patterned. In an embodiment of the invention the bottom oxide layer 31 is etched. In an embodiment of the invention, before the metallic layer deposition, silicides are performed where the bottom oxide layer 31 have been removed. Advantageously, this decreases the contact resistance between the conduction through vias 11 and 12 and the bottom electrodes 111 and 121 respectively. In an embodiment of the invention, the metallic layers 111 and 121 are deposited by sputter deposition or by sputter and electroplating. For example, said metallic layers 111 and 121 are made of aluminium or copper or gold or gold alloys as TiNiAu or TiPtAu. The patterning of the bottom electrodes 111 and 121 is performed in step 1 after deposition of the bottom metallic layer or during the deposition process.

Figure 2J:
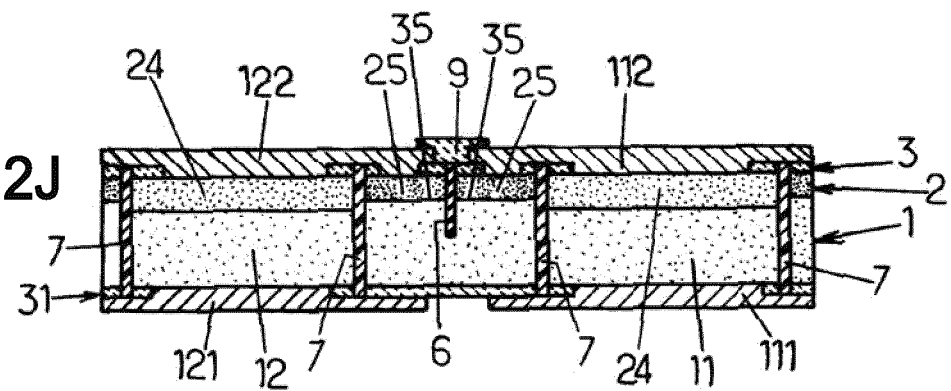

As shown in FIG. 2J, in step J the wafer is removed from the hard carrier 14 and a submount according to the invention, as described in FIG. 1, is obtained.

The juxtaposition of the insulation well of the vias and the diode implementation zone makes it possible to delimit in a single operation the outside outline of the circuit, the vias and the diode implementation zone resulting in the electrical isolating of each of the areas.

Referring to FIG. 3, an exemplary embodiment of a planarization process according to the invention for an interposer as shown in FIG. 1 is described in detail.

Figure 3A:
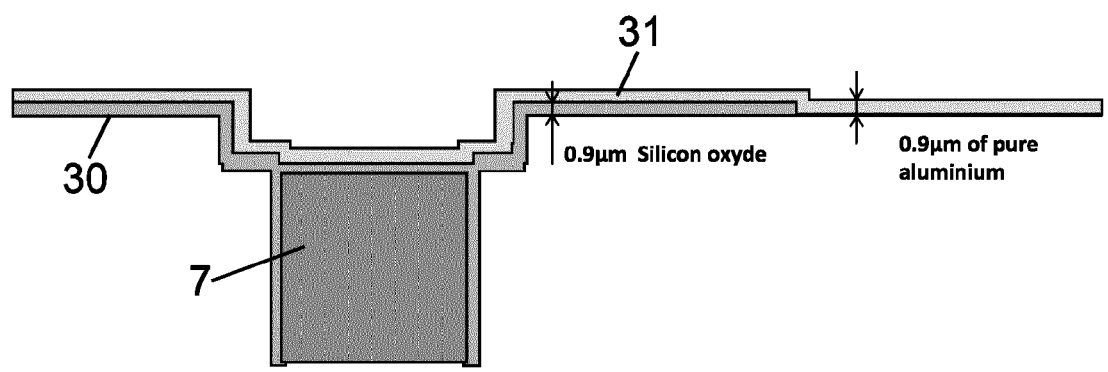
FIGS. 3A to 3F illustrate steps in the planarization process as shown in a cross section through a surrounding trench.

As illustrated in FIG. 3A, a patterned dielectric insulation layer 30 is provided, for example of silicon oxide. For example, the thickness of the dielectric insulation layer is in the range of 0.4 to 1.5 µm. In an embodiment of the invention, the dielectric layer is 0.9 µm and a first mask is used to pattern the dielectric insulation layer. In the first step A, a first layer of pure aluminium 31 is deposited on top of the silicon oxide layer. For example, the first layer of aluminium 31 is of a depth in the same range as that of the dielectric layer 30. For example, the first and subsequent metallic layers are deposited such that a layer of uniform thickness results.

Figure 3B:
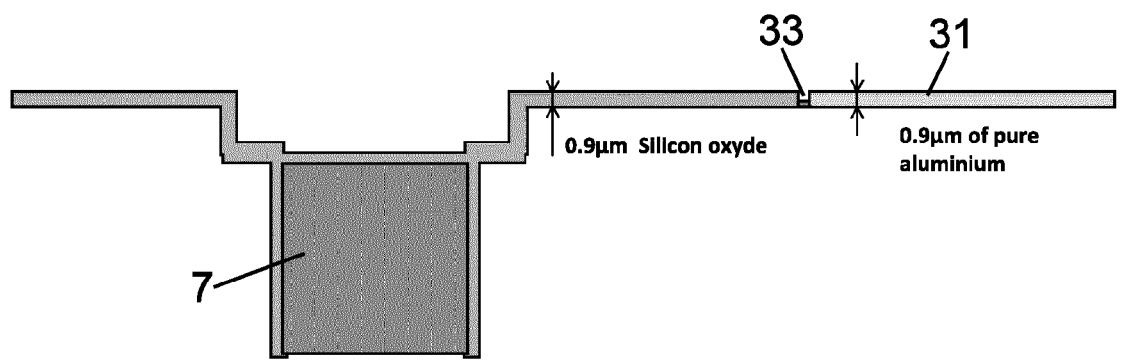

The first layer of aluminium 31 is patterned such that a planarized surface as shown in FIG. 3B is formed. The surface may have construction recesses 33 in the zones where underlying contacts are opened through the dielectric layer.

Figure 3C:
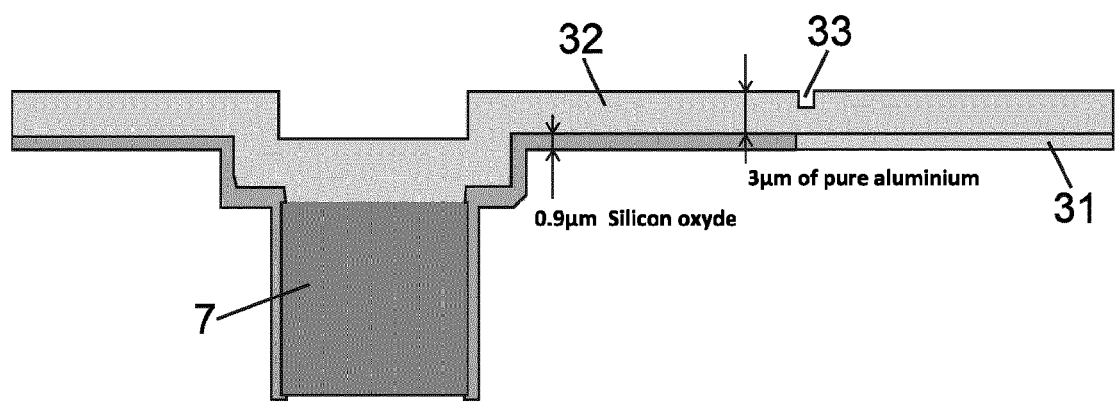

As shown in FIG. 3C, a second layer of pure aluminium 32 is deposited atop the planarized surface. For example, the thickness of the second layer of aluminium 32 is in the range of 1 to 3 µm. The second layer of aluminium 32 preserves the construction recesses 33 corresponding to the contacts in the dielectric layer, the recesses having a depth in the range of 0.4 to 1.5 µm.

Figure 3D:
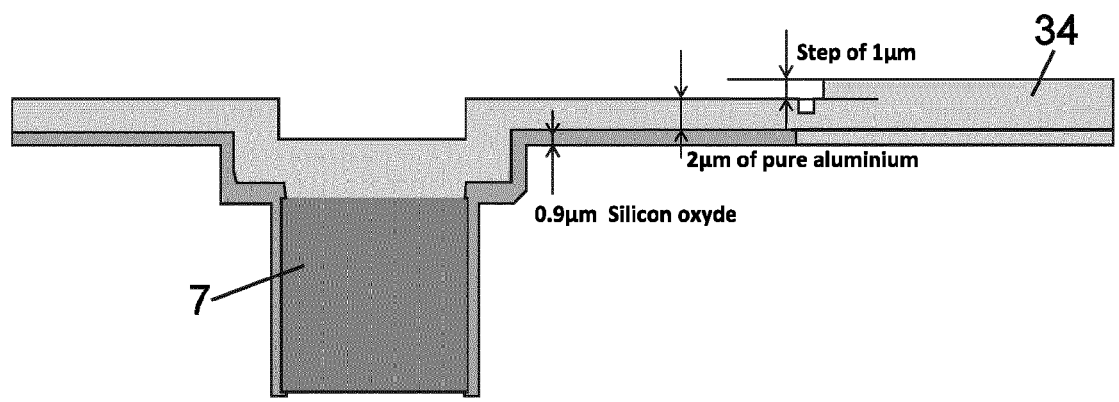

In FIG. 3D, the second layer of aluminium 32 is patterned, for example by a photolithography and etching process that can preserve the construction recesses 33 and trench delimitation. For example, after patterning, the step 34 formed by the second layer of aluminium has a thickness substantially proportional to that of the dielectric layer; in an embodiment of the invention, the thickness is 1 µm. For example, the patterning of the second layer of aluminium 32 may be time controlled. In an embodiment of the invention, a second mask is used for the etching of the second layer of aluminium that is the inverse of the first mask used in the patterning of the dielectric insulation layer.

Figure 3E:
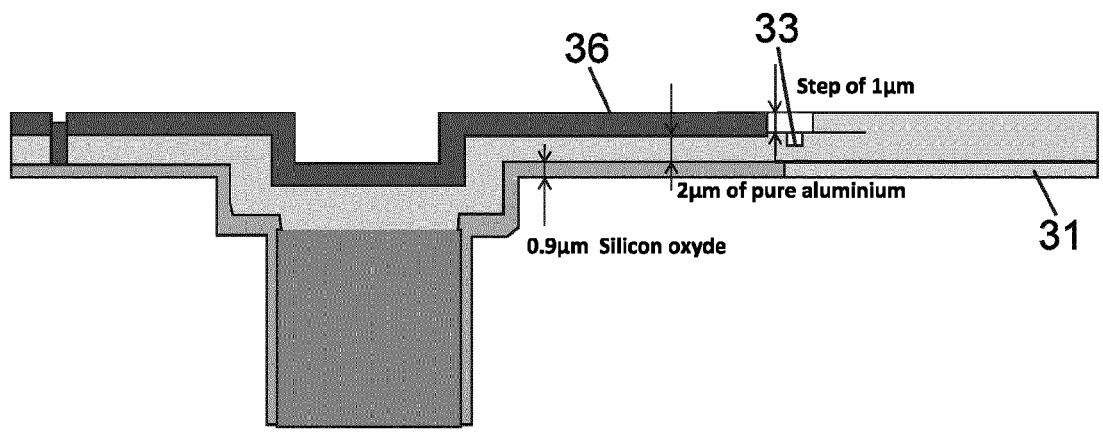

As shown in FIG. 3E, a layer of silicon oxide 36 is formed and patterned such that the construction recesses 33 are maintained.

Figure 3F:
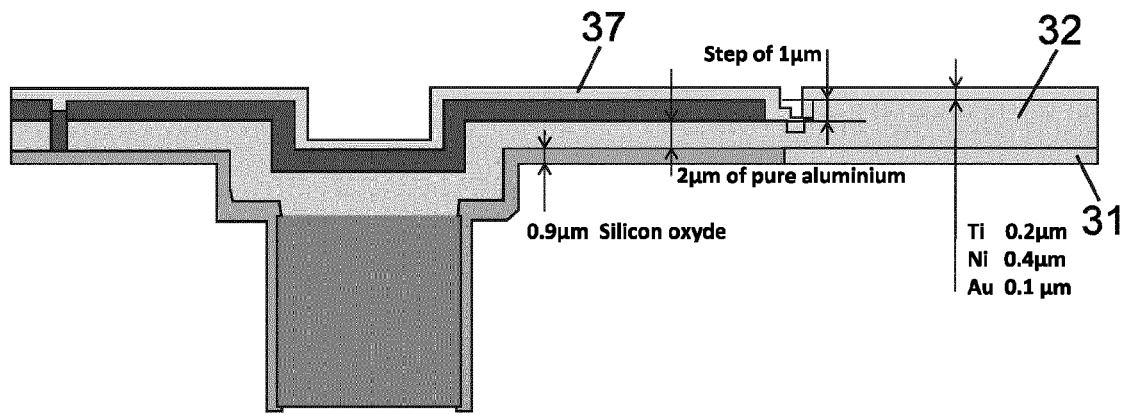

In a further embodiment of the present invention, FIG. 3F shows a titanium barrier layer 37 deposited so as to encapsulate the second layer 32 of aluminium. For example, the second aluminium layer 32 may be etched to a depth whereby the titanium barrier layer is reached.

This planarization process can be realised to create desired surface conditions for each level of interconnection.

The planarization process creates a structure used as a base for LEDs with a planarity of the front face comprised between 0.1 µm and 1 µm. This planarity makes it possible to have a step of collective transfer corresponding to a wafer on wafer bonding by thermo-compression and allows every bump of the LED interposer to contact the facing LED substrate in a satisfactory way, and at least on the overall surface of a wafer. Further, the method of the present invention is suitable for use with a variety of conductive layers, including aluminium.

The juxtaposition of the insulation well of the vias with the implementation zones of the diodes makes it possible to delimit in a single step of lithography the outside outline of the circuit, the vias and the diodes embedded between the vias and to isolate electrically these various elements one from the others in the periphery. The ratios of width of trenches are adjusted to allow increased speed of engraving of the surrounding trenches with respect to the diode trench. The single operation obtains a result consisting of two trenches cutting and isolating the vias that cross the silicon substrate having a typical depth of 200 to 700 μm. The insulating diode trench crosses the epitaxial layer only, to a depth in the range of 1 to 20 μm thereby protecting the continuity of the electrical connection between the diodes by the substratum.

Although embodiments of the present disclosure have been described in detail, those skilled in the art should understand that they may make various changes, substitutions and alterations herein without departing from the spirit and scope of the present disclosure.

The invention claimed is:

1. An interposer device comprising
a doped silicon substrate having an epitaxial layer on a first side and two through vias extending from the first side to a second side opposite to the first side of the doped silicon substrate, wherein each through via comprises a volume of doped silicon substrate delimited by a surrounding trench extending from the first to the second side of the doped silicon substrate such that said surrounding trench is arranged so as to electrically isolate the doped silicon substrate surrounded by said trench;
first and second conductive layers laid respectively on first and second sides of the first through via so as to be electrically connected together;
third and fourth conductive layers laid respectively on surfaces of the second through via so as to be electrically connected together, the first and third conductive layers being connected together by means of a back-to-back diode wherein the corresponding diodes are isolated by a diode trench having a depth at least equal to that of the epitaxial layer.

2. The interposer device according to claim 1, wherein the ratio H/S is smaller or equal to 1, with H the average distance between the first and second side of the through via and S the average width of the through via.

3. The interposer device according to claim 1, wherein the surrounding trench is at least partially filled with an isolating material, said isolating material being a first dielectric material, and the filling of the trench is completed by conformal deposition of a second dielectric material.

4. The interposer device according to claim 1, wherein the ratio H/e is greater or equal to 15, with H the average distance between the first and second side of the through via and e the average thickness of the surrounding trench.

5. The interposer device of claim 1, further comprising:
a first layer of aluminum formed selectively and between regions of an oxide layer on a first surface of the silicon substrate;
a second layer of aluminum formed on the first layer of aluminum and on the oxide layer; and
a layer of silicon oxide,
wherein said first and second aluminum layers are formed prior to the first and second conductive layers.

6. The interposer device of claim 1, wherein the surrounding trenches have a depth of 200-700 μm.

7. The interposer device of claim 1 wherein the diode trench has a depth of 1-20 μm.

8. A method of forming an interposer device according to claim 1, comprising:
providing a doped silicon substrate having an epitaxial layer with a doping different to that of the remaining silicon substrate;
delimiting two through vias extending from a first to a second side of the doped silicon substrate, a diode implementation zone between the vias and a diode trench delimiting first and second areas of the diode implementation zone;
respectively isolating electrically each via, the first area and the second area of the diode implementation zone;
laying first and second conductive layers respectively on first and second sides of the first through via so as to be electrically connected together; and
laying third and fourth conductive layers respectively on surfaces of the second through via so as to be electrically connected together;
wherein the first and third conductive layers being connected by the diodes of the diode implementation zone.

9. The method of claim 8, further comprising a planarization process applied to at least one side of the silicon substrate, the planarization process comprising the steps of:
deposition of a dielectric insulation layer on a first metallic layer;
patterning of contacts in the dielectric insulation layer;
deposition of a first metallic layer on the dielectric insulation layer;
patterning of the first metallic layer;
deposition of a second metallic layer; and
patterning of the second metallic layer.

10. The method of claim 8, wherein a barrier layer is deposed encapsulating the first and second conductive layers, wherein said barrier layer is titanium based.

11. The method of claim 8, wherein the steps are repeated to construct second and/or subsequent levels of interconnection.

12. The method of claim 8, wherein the dielectric insulation layer has a thickness of 0.4 to 1.5 μm.

13. The method of claim 8, wherein the first and second conductive layers have a thickness of 1 to 3 μm.

14. The method of claim 8, wherein the first and second conductive layers are formed by constructing recesses in the zones where underlying contacts are opened through the dielectric insulation layer.

15. The method of claim 8, wherein patterning of contacts in the dielectric insulation layer is realised using a first mask and wherein patterning of the second metallic layer is realised using a second mask that is the inverse of the first mask.

16. The method according to claim 8, wherein the second metallic layer is etched to a depth whereby the barrier layer is exposed.

17. The interposer device of claim 3, wherein the first dielectric material is thermal silicon oxide, and the second dielectric material is polysilicon or an insulating material.

18. The interposer device of claim 1, wherein the surrounding trenches have a depth of 200-300 μm.

* * * * *